United States Patent [19]

Kim

[11] Patent Number: 5,550,080
[45] Date of Patent: Aug. 27, 1996

[54] METHOD FOR FABRICATING CAPACITORS OF SEMICONDUCTOR DEVICE

[75] Inventor: Suk S. Kim, Kyoungki-do, Rep. of Korea

[73] Assignee: Hyundai Electronics Industries Co., Ltd., Kyoungki-do, Rep. of Korea

[21] Appl. No.: 510,174

[22] Filed: Aug. 2, 1995

[30] Foreign Application Priority Data

Aug. 3, 1994 [KR] Rep. of Korea .................. 94-19192

[51] Int. Cl.⁶ ................................. H01L 21/70
[52] U.S. Cl. .................. 437/60; 437/47; 437/52; 437/919; 148/DIG. 14
[58] Field of Search ................... 437/60, 52, 47, 437/49, 919; 148/DIG. 14

[56] References Cited

U.S. PATENT DOCUMENTS

| | | | |
|---|---|---|---|
| 5,162,253 | 11/1992 | Takeuchi | 437/52 |
| 5,206,787 | 4/1993 | Fujoka | 437/52 |
| 5,385,859 | 1/1995 | Enomoto | 437/52 |
| 5,441,909 | 8/1995 | Kim | 437/52 |

*Primary Examiner*—Tuan H. Nguyen
*Attorney, Agent, or Firm*—Morgan & Finnegan, L.L.P.

[57] ABSTRACT

A method for fabricating capacitors of a semiconductor device capable of increasing the surface area of the storage electrode using both an adjustment for the dimension of a contact mask for the storage electrode and a technique of selective growth, thereby achieving an improvement in capacitance. The method includes the steps of forming a storage electrode with an increased surface area using the technique for adjusting the contact mask dimension, the technique of selective growth and a wet etch process, and then forming a dielectric film and a plate electrode over the storage electrode.

5 Claims, 3 Drawing Sheets

METHOD FOR FABRICATING CAPACITORS OF SEMICONDUCTOR DEVICE

BACKGROUND OF THE INVENTION

1. Field of the Invention

The present invention relates to a method for fabricating capacitors of a semiconductor device, and more particularly to a method for fabricating capacitors using a selective growth technique and a technique for adjusting the dimension of a storage electrode contact mask to provide an increased capacitance in highly integrated semiconductor devices.

2. Description of the Prior Art

Recent high integration trend of semiconductor devices inevitably involves a reduction in cell dimension. However, such a reduction in cell dimension results in a difficulty to form capacitors having a sufficient capacitance. This is because the capacitance is proportional to the surface area of capacitor. In a case of a dynamic random access memory (DRAM) device constituted by one metal oxide semiconductor (MOS) transistor and one capacitor, in particular, it is important to reduce the cell dimension and yet obtain a high capacitance of the capacitor, for the high integration of the DRAM device. For increasing the capacitance, various researches have been conducted. For example, there have been known use of dielectric films made of a dielectric material exhibiting a high dielectric constant, formation of thin dielectric layers, and formation of capacitors having an increased surface area.

However, all of these methods have their own problems, respectively. Although various materials, such as $Ta_2O_3$, $TiO_2$ or $SrTiO_3$, have been proposed as the dielectric material exhibiting a high dielectric constant, their reliance and thin film characteristics have not been confirmed. For this reason, it is difficult to practically use such dielectric materials for semiconductor devices. The reduction in thickness of dielectric layer results in damage of the dielectric layer severely affecting the reliance of the capacitor.

In order to increase the surface area of the capacitor, various capacitor structures have also been proposed. They include a fin structure, a labyrinthian structure with a cylindrical or rectangular shape, and a structure having hemispherical grain of silicon on storage electrode. In these capacitor structures, however, the capacitance is still insufficient because the surface area of the capacitor is still small due to its reduction caused by the high integration of DRAM.

SUMMARY OF THE INVENTION

Therefore, an object of the invention is to solve the above mentioned problems and to provide a method for fabricating capacitors of a semiconductor device capable of increasing the surface area of the storage electrode using a technique for adjusting the dimension of a contact mask for the storage electrode and a selective growth technique, thereby achieving an improvement in capacitance.

In accordance with the present invention, this object is accomplished by providing a method for fabricating a capacitor of a semiconductor device comprising the steps of: forming a lower insulating layer on a semiconductor substrate, depositing a first insulating film on the lower insulating layer, and then forming a first storage electrode contact mask on the first insulating film; selectively growing the first insulating film, thereby forming a selectively-grown oxide film, and then removing the first contact mask; forming a first conduction layer to a predetermined thickness on the resulting structure obtained after the removal of the first contact mask, coating a second insulating film on the first conduction layer, planarizing the second insulating film using a full etch process, and then forming a second storage electrode contact mask on the second insulating film; sequentially etching the first conduction layer, the selectively grown oxide film, the first insulating film and the lower insulating layer using the second contact mask, thereby forming a contact hole for exposing a predetermined portion of the semiconductor substrate; depositing a second conduction layer to a predetermined thickness on the resulting structure obtained after the formation of the contact hole such that the second conduction layer is in contact with the semiconductor substrate through the contact hole, and then forming a storage electrode mask on the second conduction layer; sequentially etching the second conduction layer, the second insulating film and the first conduction layer using the storage electrode mask, thereby forming a second-conduction layer pattern and a first-conduction layer pattern, and then removing the storage electrode mask; and removing the second insulating film, the first insulating film and the selectively-grown oxide film using a wet etch process, whereby a storage electrode with an increased surface area is formed.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 5 illustrate a method for fabricating capacitors of a semiconductor device in accordance with an embodiment of the present invention.

Figure 1:
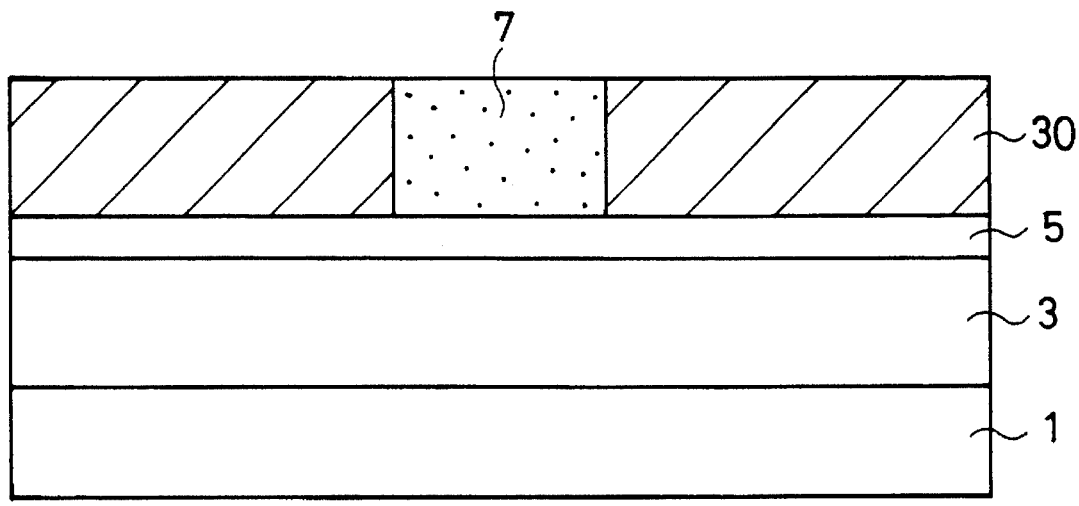
FIGS. 1 to 5 are sectional views respectively illustrating a method for fabricating capacitors of a semiconductor device in accordance with the present invention.

In accordance with the method of the present invention, a semiconductor substrate 1 is prepared and then a lower insulating layer 3 is formed on the semiconductor substrate 1 as shown in FIG. 1. On the lower insulating layer 3, a first insulating film 5 is then deposited. Thereafter, a first storage electrode contact mask 30 is formed on the first insulating film 5 and then the first insulating film 5 is selectively grown, thereby forming a selectively-grown oxide film 7. In the illustrated case, the first contact mask 30 has a contact hole dimension larger than a required contact hole dimension. The formation of the selectively-grown oxide film 7 is carried out using the first contact mask 30 as a growth barrier such that the upper surface of the selectively-grown oxide film 7 is flush with the upper surface of the first contact mask 30. Although an element-isolating oxide film, a bit line and a word line are formed between the lower insulating layer 3 and the substrate 1, they are not shown in the figure. The lower insulating layer 3 is comprised of a planarized, silicon-based oxide film which is made of, for example, TEOS or BPSG exhibiting an excellent flowability. The first insulating film 5 is comprised of an oxide film.

Figure 2:
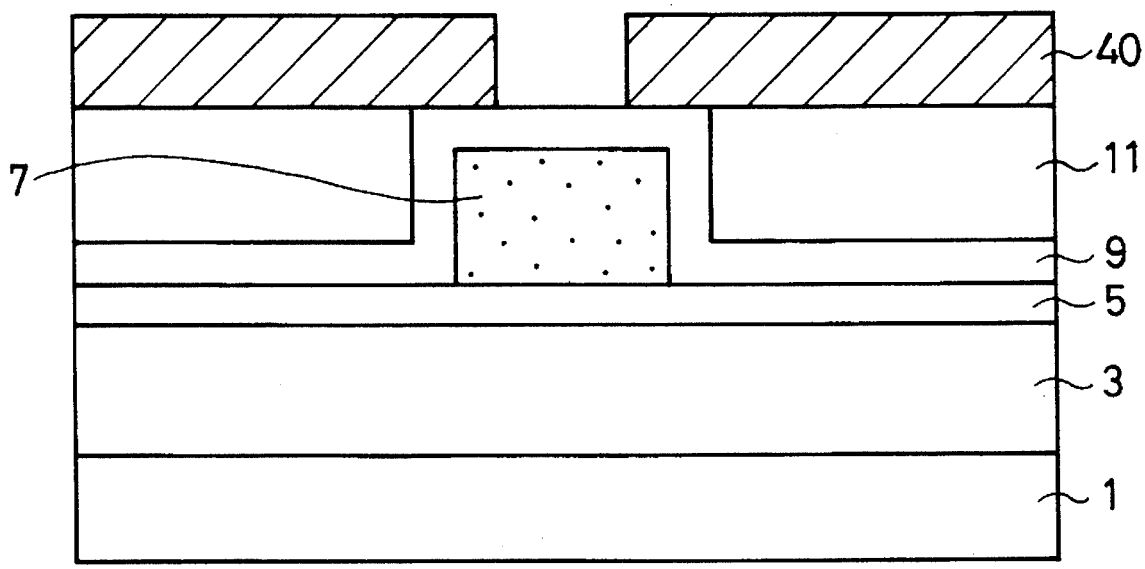

Thereafter, the first contact mask 30 is removed, as shown in FIG. 2. On the resulting structure, a first conduction layer 9 is then deposited. Thereafter, a second insulating film 11 is formed over the first conduction layer 9 and then planarized such that its upper surface is flush with an upper surface portion of the first contact mask disposed on the selectively-grown oxide film 7. On the resulting structure, a second storage electrode contact mask 40 is formed which has a contact hole dimension smaller than the contact hole dimension of the first contact mask 30. The second insulating film 11 is formed by thickly forming an oxide film on the first conduction layer 9, and then fully etching the oxide film such that the upper surface of the oxide film is flush with the upper surface portion of the first conduction layer 9 disposed on the selectively-grown oxide film 7.

Figure 3:
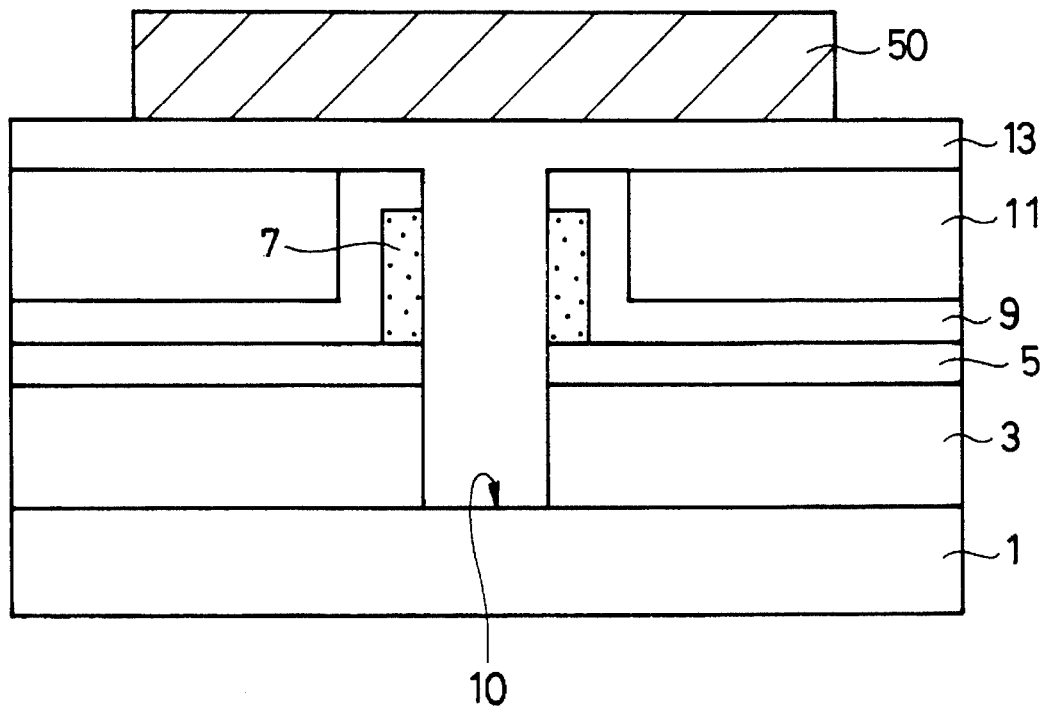

Using the second contact mask 40, all the first conduction layer 9, the selectively-grown oxide film 7, the first insulating film 5 and the lower insulating film 3 are then sequentially etched, thereby forming a contact hole 10 for exposing a desired portion of the semiconductor substrate 1, as shown in FIG. 3. On the resulting structure, a second conduction layer 13 is deposited so that it is in contact with the exposed portion of the semiconductor substrate 1 through the contact hole 10. Subsequently, a storage electrode mask 50 is formed on the second conduction layer 13.

Figure 4:
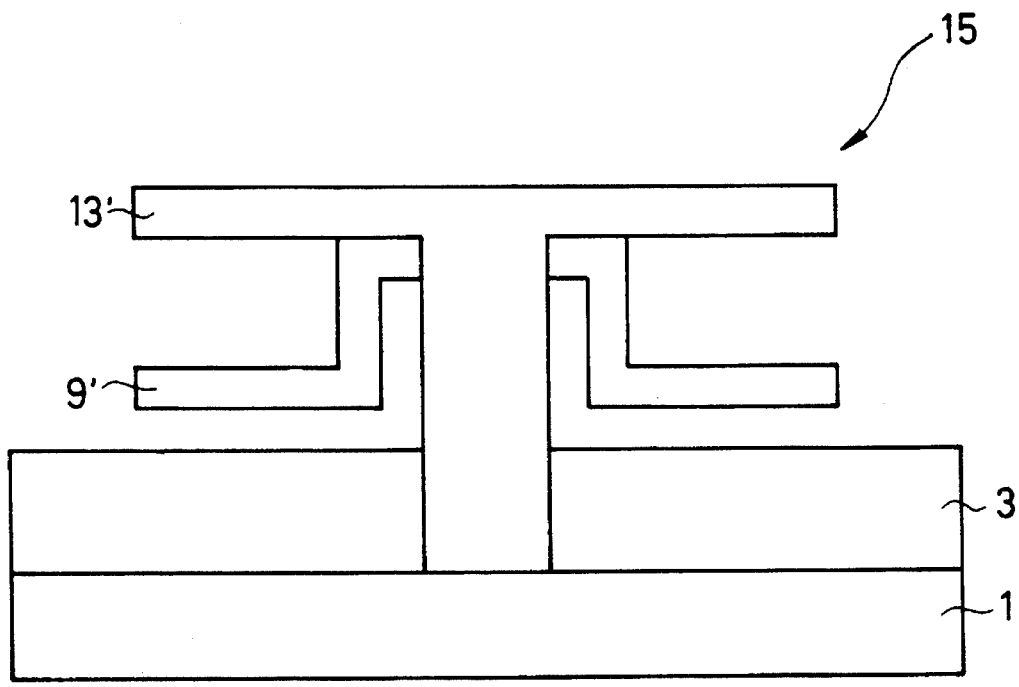

Using the storage electrode mask 50, all the second conduction layer 13, the second insulating film 11 and the first conduction layer 9 are then sequentially etched, thereby forming a second-conduction layer pattern 13' and a first-conduction layer pattern 9', as shown in FIG. 4. After completing this etching, the second insulating film 11 and the first insulating film 5 are exposed. Thereafter, the storage electrode mask 50 is removed. Also, the exposed first and second insulating films 5 and 11 are removed using a wet etch process. As a result, the selectively-grown oxide film 7 is exposed which is, in turn, removed using the wet etch process. Thus, a storage electrode 15 constituted by the first conduction layer pattern 9' and the second conduction layer pattern 13' is obtained, which has an increased surface area. The wet etching is carried out using a buffered oxide etchant (BOE) or a hydrofluorine (HF) solution.

Figure 5:
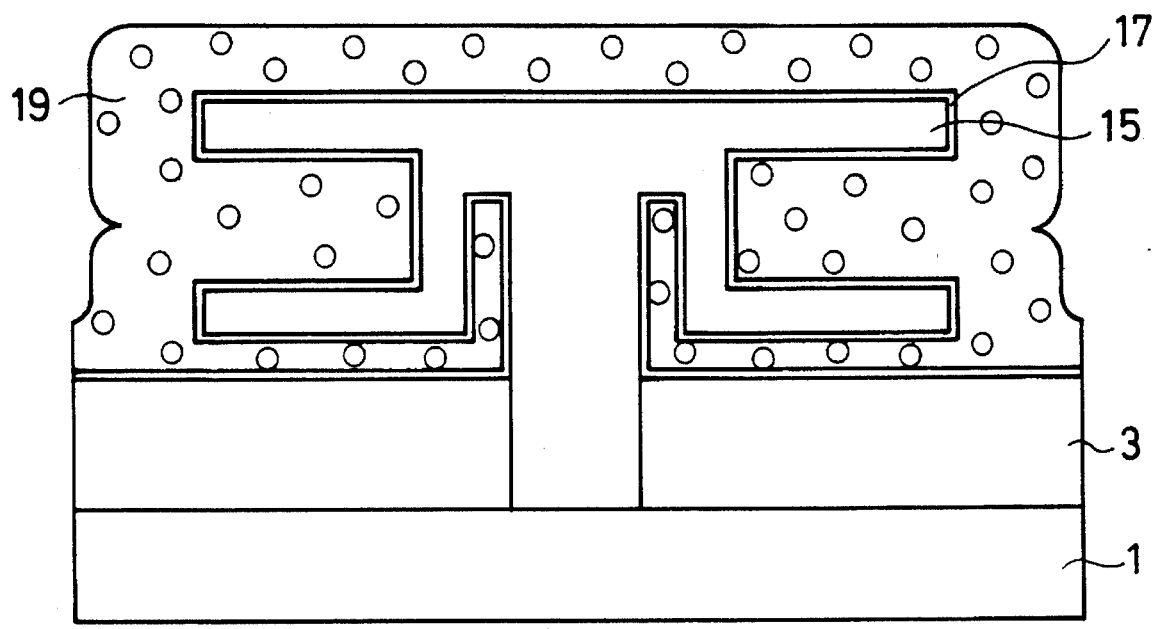

On the resulting structure, finally, a dielectric film 17 and a plate electrode 19 are formed, as shown in FIG. 5. Thus, a capacitor with a sufficient capacitance is obtained. The dielectric film 17 is comprised of an insulating film whereas the plate electrode 19 is made of a conduction material.

As apparent from the above description, the present invention provides a method for fabricating capacitors of a semiconductor device capable of increasing the surface area of the storage electrode using a technique for adjusting the dimension of the storage electrode contact mask and a selective growth technique, thereby achieving an improvement in capacitance. Accordingly, it is possible to fabricate highly integrated semiconductor devices. Since a planarization is carried out for an upper structure of the capacitor in accordance with the present invention, subsequent process steps can be easily carried out.

Although the preferred embodiment of the invention has been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor device comprising the steps of:

forming a lower insulating layer on a semiconductor substrate, depositing a first insulating film on the lower insulating layer, and then forming a first storage electrode contact mask on the first insulating film;

selectively growing the first insulating film, thereby forming a selectively-grown oxide film, and then removing the first contact mask;

forming a first conduction layer on the resulting structure obtained after the removal of the first contact mask, coating a second insulating film on the first conduction layer, planarizing the second insulating film using a full etch process, and then forming a second storage electrode contact mask on the second insulating film;

sequentially etching the first conduction layer, the selectively-grown oxide film, the first insulating film and the lower insulating layer using the second contact mask, thereby forming a contact hole for exposing a portion of the semiconductor substrate;

depositing a second conduction layer on the resulting structure obtained after the formation of the contact hole such that the second conduction layer is in contact with the semiconductor substrate through the contact hole, and then forming a storage electrode mask on the second conduction layer;

sequentially etching the second conduction layer, the second insulating film and the first conduction layer using the storage electrode mask, thereby forming a second-conduction layer pattern and a first-conduction layer pattern, and then removing the storage electrode mask; and removing the second insulating film, the first insulating film and the selectively-grown oxide film using a wet etch process, whereby a storage electrode with an increased surface area is formed.

2. The method in accordance with claim 1, wherein the first storage electrode contact mask has a dimension larger than a required contact hole dimension.

3. The method in accordance with claim 1, wherein the selectively-grown oxide film is formed using the first storage electrode contact mask as a growth barrier.

4. The method in accordance with claim 1, wherein the step of coating the second insulating film comprises the step of depositing an insulating film on the first conduction layer, and the step of planarizing the second insulating film comprises the step of fully etching the insulating film such that an upper surface of the insulating film is flush with an upper surface portion of the first conduction layer disposed on the selectively-grown oxide film.

5. The method in accordance with claim 1, wherein the wet etch process is carried out using a buffered oxide etchant or a hydrofluorine solution.

\* \* \* \* \*